United States Patent
Tomioka et al.

(10) Patent No.: US 6,917,521 B2
(45) Date of Patent: Jul. 12, 2005

(54) CENTRIFUGAL BLOWER UNIT HAVING SWIRL CHAMBER, AND ELECTRONIC APPARATUS EQUIPPED WITH CENTRIFUGAL BLOWER UNIT

(75) Inventors: Kentaro Tomioka, Sayama (JP); Kenichi Ishikawa, Hamura (JP); Katsumi Hisano, Matsudo (JP); Kei Matsuoka, Kawasaki (JP); Hideyuki Toma, Kodaira (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 49 days.

(21) Appl. No.: 10/327,973

(22) Filed: Dec. 26, 2002

(65) Prior Publication Data

US 2003/0142476 A1 Jul. 31, 2003

(30) Foreign Application Priority Data

Jan. 29, 2002 (JP) .................................... 2002-020360

(51) Int. Cl.⁷ .............................................. F04D 29/44
(52) U.S. Cl. .................... 361/695; 361/692; 361/687; 415/119; 415/211.1
(58) Field of Search ................. 415/119, 204, 415/203, 15, 206, 211.1, 211.2, 212.1, 214.1, 207, 182

(56) References Cited

U.S. PATENT DOCUMENTS 5,281,092 A * 1/1994 Sullivan .................... 415/206
5,839,879 A * 11/1998 Kameoka et al. ........... 415/206
5,842,840 A   12/1998 Korek et al.
6,442,025 B2 * 8/2002 Nakamura et al. .......... 361/695
6,650,540 B2 * 11/2003 Ishikawa .................... 361/695
6,665,181 B2 * 12/2003 Tanaka et al. .............. 361/695
2002/0064457 A1 * 5/2002 Pauly
2003/0002254 A1 * 1/2003 Faneuf
2003/0043546 A1 * 3/2003 Novotny

FOREIGN PATENT DOCUMENTS

| CN | 2459693 | 11/2001 | |
|---|---|---|---|
| JP | 56-2096 | 1/1981 | |
| JP | 405195995 A | * 8/1993 | ........... F04D/29/44 |
| JP | 07224796 A | * 8/1995 | ........... F04D/17/08 |
| JP | 09158898 A | * 6/1997 | ........... F04D/29/44 |
| JP | 2000-214958 | 8/2000 | |

* cited by examiner

Primary Examiner—Michael Datskovsky
(74) Attorney, Agent, or Firm—Finnegan, Henderson, Farabow, Garrett & Dunner, L.L.P.

(57) ABSTRACT

An electronic apparatus is provided with a housing containing a heat generating component, and a blower unit contained in the housing and used to cool the heat generating component. The blower unit includes an impeller, and a casing containing the impeller. The casing has suction ports, a chamber located around the impeller and a discharge port located at the downstream end of the chamber. The chamber has a depth gradually increased radially away from the impeller.

10 Claims, 4 Drawing Sheets

CENTRIFUGAL BLOWER UNIT HAVING SWIRL CHAMBER, AND ELECTRONIC APPARATUS EQUIPPED WITH CENTRIFUGAL BLOWER UNIT

CROSS-REFERENCE TO RELATED APPLICATIONS

This application is based upon and claims the benefit of priority from the prior Japanese Patent Application No. 2002-020360, filed Jan. 29, 2002, the entire contents of which are incorporated by reference.

BACKGROUND OF THE INVENTION

1. Field of the Invention

The present invention relates to a centrifugal blower unit having a swirl chamber for converting the velocity energy of the air discharged from an impeller into pressure energy, and an electronic apparatus, such as a portable computer, equipped with the centrifugal blower unit.

2. Description of the Related Art

Portable electronic apparatuses such as portable computers are equipped with a microprocessor for processing various types of information. The amount of heat generated by the microprocessor is increasing more and more due to the increase in the processing speed and/or enhancement of versatility. Accordingly, to maintain the electronic apparatus in a stable state, it is necessary to increase the dissipation of heat from the microprocessors.

The apparatuses have a cooling unit for forcibly cooling the microprocessor. The cooling unit comprises a radiator section thermally connected to the microprocessor, and a centrifugal blower unit for applying cooling air to the radiator section, and is housed within a housing of the electronic apparatus.

The centrifugal blower unit comprises a rotary impeller and a casing that receives it. The casing has a suction port for allowing air to be drawn into the impeller, a swirl chamber containing the impeller, and a discharge port located at the downstream end of the swirl chamber.

When the impeller is rotating, the air inside the housing or external air is drawn into the impeller. This air is discharged from the outer periphery of the impeller into the swirl chamber by centrifugal force. In the swirl chamber, the air discharged from the impeller is guided to the discharge port, from which the air serving as cooling air is applied to the radiator section. The heat transmitted from the microprocessor to the radiator section is dissipated as a result of heat exchange using the cooling air, and is guided to the outside of the housing by the cooling airflow.

The swirl chamber of the casing serves to convert the velocity energy of the air, discharged from the impeller, into pressure energy. Thus, in the centrifugal blower units, the casing is extended radially outward with respect to the impeller, thereby gradually increasing the cross sectional area of the cooling air passage from the beginning to the end of the swirl chamber.

However, if the casing is extended radially outward with respect to the impeller, it inevitably has a large planar size. Therefore, the outer peripheral portion of the casing reaches a position above a printed wiring board mounted with the microprocessor, since the casing is housed in the housing adjacent to the printed wiring board. In general, a power supply circuit dedicated to the microprocessor is provided on the printed wiring board around the microprocessor. Tall circuit components such as coils, capacitors, etc. are disposed on the board, and thus interfere with the outer peripheral portion of the casing.

BRIEF SUMMARY OF THE INVENTION

It is an embodiment of the invention to provide a centrifugal blower unit that incorporates a swirl chamber of a shape which both provides a large cross section for discharging a large volume of air, yet takes up relatively little space on its main mounting plane.

It is another embodiment of the invention to provide an electronic apparatus that has the above-mentioned centrifugal blower unit and hence a high cooling efficiency.

According to an embodiment of the invention, there is provided a centrifugal blower unit comprising a rotary impeller, and a casing containing the impeller. The casing has suction ports which introduce air into a center of rotation of the impeller, a swirl chamber located around the impeller and used to gather air discharged from an outer periphery of the impeller, and a discharge port located at a downstream end of the swirl chamber. The swirl chamber has a depth gradually increased radially away from the impeller.

By virtue of this structure, the cross sectional area of the swirl chamber can be increased without increasing the planar size of the casing. Accordingly, the velocity energy of the air discharged from the outer periphery of the impeller to the swirl chamber can be efficiently converted into pressure energy, whereby the amount of the air discharged through the discharge port can be increased.

Additional embodiments and advantages of the invention will be set forth in the description which follows, and in part will be obvious from the description, or may be learned by practice of the invention. The embodiments and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Referring first to FIGS. 1–5, a first embodiment of the invention will be described.

Figure 1:
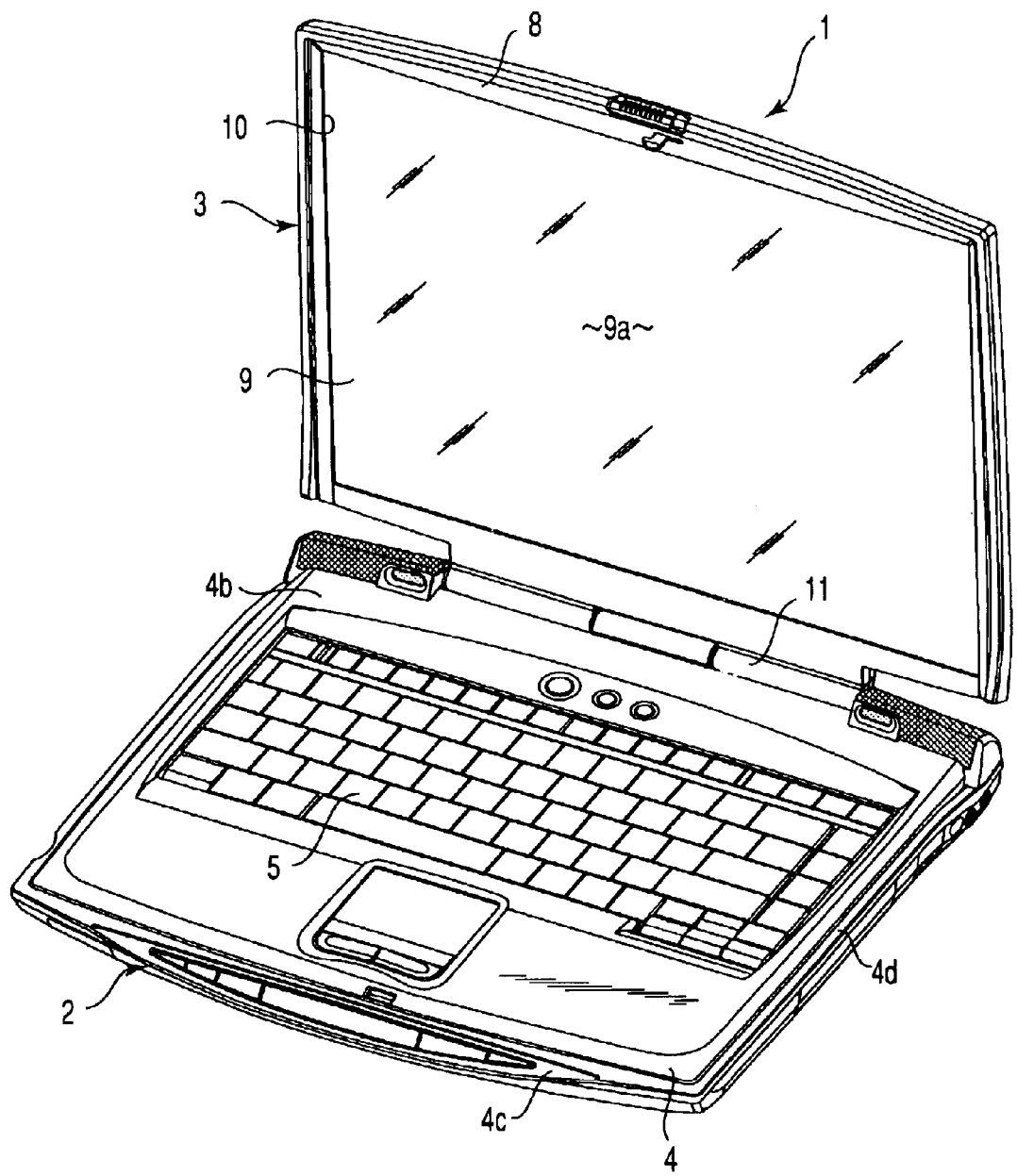
FIG. 1 is a perspective view illustrating a portable computer according to a first embodiment of the invention.
Figure 2:
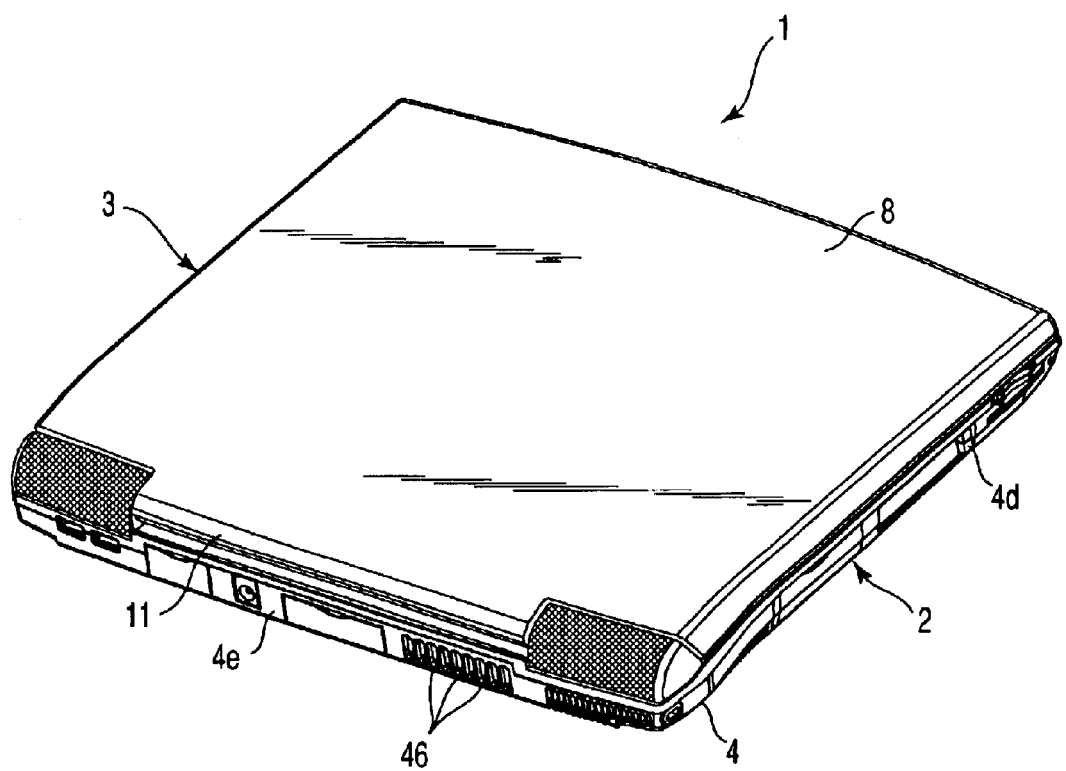
FIG. 2 is a perspective view illustrating the positions of discharge ports provided in the housing of the portable computer.

FIGS. 1 and 2 show a portable computer 1 as an electronic apparatus. The portable computer 1 comprises a computer main unit 2, and a display unit 3 supported by the main unit 2.

The main unit 2 has a flat box-shaped housing 4. The housing 4 has a bottom wall 4a, upper wall 4b, front wall 4c, right and left sidewalls 4d and rear wall 4e. The bottom wall 4a, and upper wall 4b oppose each other in the thickness direction of the housing 4. A keyboard 5 is provided on the upper wall 4b.

The display unit 3 comprises a display housing 8 and liquid crystal display panel 9 housed in the display housing 8. The display screen 9a of the liquid crystal display panel 9 is exposed from an opening 10, formed in the front surface of the display housing 8, to the outside of the display unit 3. The display housing 8 is coupled to the rear end of the housing 4 by hinge units (not shown). Accordingly, the display unit 3 is pivotable between a closed position in which it covers the upper wall 4b and keyboard 5 from above, and an open position in which the upper wall 4b, keyboard 5 and display screen 9a are exposed.

Figure 3:
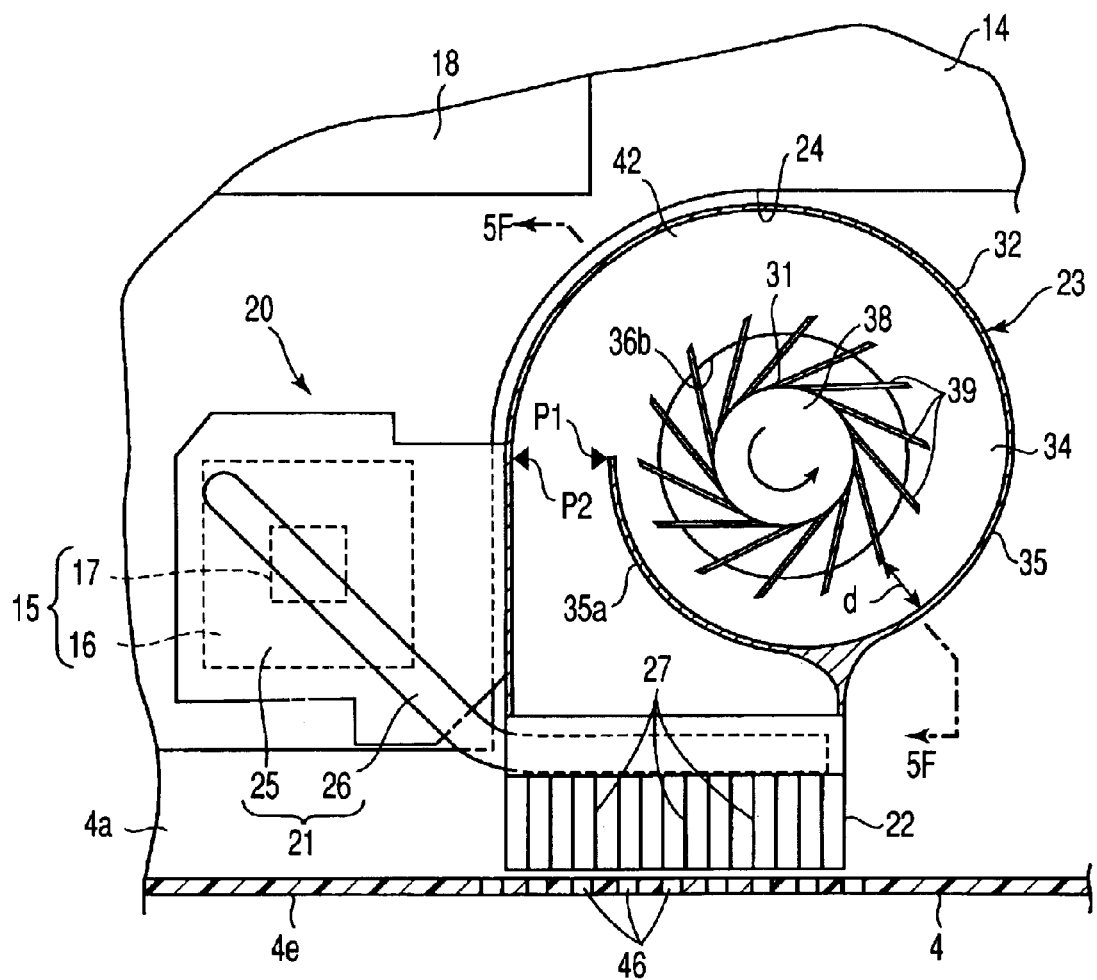
FIG. 3 is a plan view of the portable computer illustrating a state in which a cooling unit having a centrifugal blower unit is housed in the housing.

As shown in FIG. 3, the housing 4 houses a printed wiring board 14 and cooling unit 20. The printed wiring board 14 is located parallel to the bottom wall 4a of the housing 4. A semiconductor package 15 as a heat generating component and power supply circuit 18 dedicated to the package 15 are mounted on the upper surface of the board 14. The semiconductor package 15 has a microprocessor as the central core of the portable computer 1, and is located at one end of the rear portion of the housing 4. The power supply circuit 18 is located near the semiconductor package 15 and has a plurality of tall circuit components (not shown).

The semiconductor package 15 includes a base plate 16 and IC chip 17. The base plate 16 is soldered onto the upper surface of the printed wiring board 14. The IC chip 17 is mounted on the central portion of the upper surface of the base plate 16. The IC chip 17 generates a large amount of heat during operation, and hence needs to be cooled in order to maintain stable operation.

The cooling unit 20 is provided for forcibly cooling the semiconductor package 15. As shown in FIG. 3, the cooling unit 20 comprises a heat transmission section 21, a radiator section 22 and centrifugal blower unit 23. The cooling unit 20 is located adjacent to the printed wiring board 14. The printed wiring board 14 has a cutout portion 24 to make space for the centrifugal blower unit 23.

The heat transmission section 21 has a heat receiving block 25 and heat pipe 26. The heat receiving block 25 is made of a metal having thermal conductivity, such as an aluminum alloy. The heat receiving block 25 is thermally connected to the IC chip 17 via thermally conductive grease.

One end of the heat pipe 26 is thermally connected to the upper surface of the heat receiving block 25, and the other end leads to the outside of the heat receiving block 25 and extends in the length direction of the housing 4 along the rear wall 4e of the housing 4.

The radiator section 22 is made of a metal having a high thermal conductivity, such as an aluminum alloy, and a plurality of radiator fins 27. The radiator fins 27 extend parallel to each other at regular intervals. The other end of the heat pipe 26 is thermally connected to the radiator fins 27.

Figure 4:
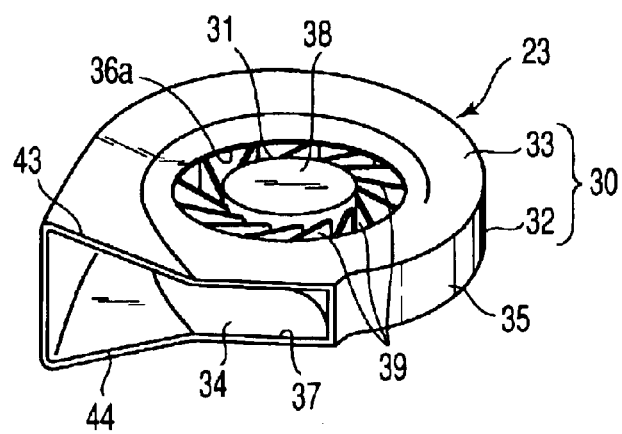
FIG. 4 is a perspective view illustrating the centrifugal blower unit.
Figure 5:
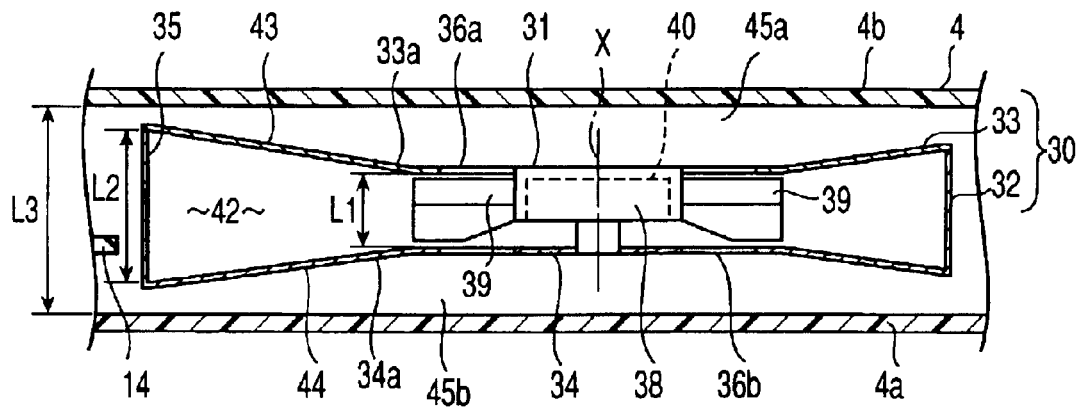
FIG. 5 is a sectional view taken along line F5—F5 in FIG. 3.

As shown in FIGS. 3 to 5, the centrifugal blower unit 23 comprises a flat box-shaped casing 30 and impeller 31 housed in the casing 30. The casing 30 is formed of a main body 32 and top plate 33. The main body 32 has a bottom plate 34 and peripheral plate 35 standing on the peripheral edge of the bottom plate 34. The bottom plate 34 and top plate 33 are both disklike members and form the outer walls of the casing 30. The peripheral plate 35 is curved arcuately and forms the peripheral wall of the casing 30. The top plate 33 is fixed to the upper edge of the peripheral plate 35 and opposes the bottom plate 34.

The casing 30 has a pair of suction ports 36a and 36b and a single discharge port 37. The suction port 36a is formed in the central portion of the top plate 33, while the other suction port 36b is formed in the central portion of the bottom plate 34. The discharge port 37 is a slim opening formed in the peripheral wall of the casing 30 and extending in the radial direction of the casing 30.

The impeller 31 has a cylindrical boss 38 and a plurality of blades 39 radially projecting from the outer periphery of the boss 38. The impeller 31 is interposed between the top plate 33 and bottom plate 34 of the casing 30, coaxially with the suction ports 36a and 36b. The impeller 31 is supported by the bottom plate 34 of the main body 32 via a motor 40 contained in the boss 38.

The motor 40 rotates the impeller 31 counter-clockwise in FIG. 3. In accordance with the rotation, the air outside the casing 30 is drawn into the impeller 31 through the suction ports 36a and 36b. This air is then discharged from the outer periphery of the impeller 31 by centrifugal force.

As shown in FIGS. 3 and 5, the casing 30 has a swirl chamber 42 that surrounds the impeller 31. The swirl chamber 42 is provided for gathering the air discharged from the outer periphery of the impeller 31 and guiding it to the discharge port 37, and has a function for converting the velocity energy of the air into pressure energy.

The shape of the swirl chamber 42 is defined by the peripheral plate 35 of the casing 32. The peripheral plate 35 has an extension 35a inwardly projecting to partially surround the impeller 31. The free end of the extension 35a defines the swirl start position P1 of the swirl chamber 42. The end of the swirl is at P2, substantially 360° around the swirl chamber 42 from P1. The distance d between the peripheral plate 35 and the outer periphery of the impeller 31 gradually increases from the swirl start position P1 to the swirl end position P2. The discharge port 37 of the casing 30 is located downstream of the swirl end position P2 of the swirl chamber 42.

As seen from FIGS. 4 and 5, the top plate 33 of the casing 30 has an outer peripheral portion 33a that defines the swirl chamber 42. The outer peripheral portion 33a of the top plate 33 has a first slope 43 inclined away from the bottom plate 34 of the casing 30. Similarly, the bottom plate 34 has an outer peripheral portion 34a that defines the swirl chamber 42. The outer peripheral portion 34a of the bottom plate 34 has a second slope 44 inclined away from the top plate 33. Thus, the casing 30 expands gradually in the radial direction of the casing 30.

More specifically, the swirl chamber 42 has an inner periphery defined by the outer periphery of the impeller 31, and an outer periphery remote from the outer periphery of the impeller 31. If the length of the inner periphery of the swirl chamber 42 is L1, and that of the outer periphery is L2, the formula L2>L1 is satisfied. Thus, the depth of the swirl chamber 42 gradually increases from the inner periphery to the outer periphery.

Further, the length L2 of the swirl chamber 42 gradually increases from the swirl start position P1 of the swirl chamber 42 to the swirl end position P2. Accordingly, the volume of the swirl chamber 42 continuously increases from the swirl start position P1 to the swirl end position P2.

In addition, the first and second slopes 43 and 44 that define the cross section of the swirl chamber 42 extend to the discharge port 37. Therefore, as seen from FIG. 4, the discharge port 37 is shaped such that the end continuous with the outer periphery of the swirl chamber 42 widens.

The casing 30 of the centrifugal blower unit 23 is fixed to the bottom wall 4a of the housing 4. Accordingly, as shown in FIG. 5, the centrifugal blower unit 23 is horizontally housed in the housing 4, with the axis-of-rotation X of the impeller 31 perpendicular to the housing 4.

Spaces 45a and 45b for air suction are formed between the top plate 33 of the casing 30 and the upper wall 4b of the housing 4, and between the bottom plate 34 of the casing 30 and the bottom wall 4a of the housing 4, respectively. The suction port 36a of the top plate 33 opens to the space 45a, while the suction port 36b of the bottom plate 34 opens to the space 45b. If the thickness of the housing 4 including the spaces 45a and 45b is L3, L3 and the lengths L1 and L2 of the swirl chamber 42 are set such that the formula L1<L2<L3 is satisfied. Accordingly, the first and second slopes 43 and 44 of the casing 30 extend to the spaces 45a and 45b, respectively.

As shown in FIG. 3, the discharge port 37 of the casing 30 opposes a plurality of outlets 46 formed in the rear wall 4e of the housing 4. The radiator section 22 of the cooling unit 20 is interposed between the discharge port 37 and outlets 46.

In the above-described structure, the IC chip 17 of the semiconductor package 15 generates heat while the portable computer 1 is used. The heat of the IC chip 17 is transmitted from the heat receiving block 25 to the radiator section 22 via the heat pipe 26. The heat transmitted to the radiator section 22 is discharged from the surfaces of the radiator fins 27 to the interior of the housing 4.

When the temperature of the semiconductor package 15 has reached a predetermined value, the impeller 31 of the centrifugal blower unit 23 is rotated. In accordance with the rotation of the impeller 31, a negative pressure occurs in the suction ports 36a and 36b of the casing 30, thus the air within the housing 4 is sucked into the impeller 31 through the suction ports 36a and 36b.

The air is discharged from the outer periphery of the impeller 31 into the swirl chamber 42 by the centrifugal force generated while the impeller is rotating, and is then guided to the discharge port 37 through the chamber 42. The air guided to the discharge port 37, which serves as cooling air, is blown onto the radiator section 22 and passed between the radiator fins 27. As a result, the radiator section 22 is forcibly cooled, i.e., the heat generated by the IC chip 17 and transmitted to the radiator section 22 is transferred to the cooling air by the heat exchange between the radiator section 22 and cooling air. The cooling air, which is heated as a result of the heat exchange, is exhausted to the outside of the housing 4 through the outlets 46.

In the centrifugal blower unit 23 constructed as above, the velocity energy of the air discharged from the impeller 31 is converted into pressure energy, using the swirl chamber 42 of the casing 30, thereby increasing the pressure of the suction air. In the casing 30 that defines the swirl chamber 42, the outer peripheral portion 33a of the top plate 33 and the outer peripheral portion 34a of the bottom plate 34 are inclined in opposite directions. In other words, the swirl chamber 42 is constructed such that the depth of the chamber gradually increases radially away from the axis of the impeller 31, whereby the velocity energy of the air discharged from the outer periphery of the impeller 31 into the swirl chamber 42 can be efficiently converted into pressure energy. As a result, the amount of the cooling air discharged from the discharge port 37 is increased, which enables efficient heat exchange to be executed between the cooling air and the radiator section 22.

Thus, the performance of cooling the semiconductor package 15 is enhanced, and hence the operation temperature of the semiconductor package 15 can be appropriately adjusted even when the package 15 is driven at its maximum capacity.

Further, the casing 30 does not occupy a large area in a radial direction with respect to the impeller 31, which means that the cutout portion 24 of the printed wiring board 14 can be made small. Accordingly, the printed wiring board 14 can have a sufficient mount area.

Furthermore, even if the casing 30 and printed wiring board 14 must be arranged to overlap each other, the overlapping area can be minimized. Thus, the interference between the casing 30 and the circuit components of the power supply circuit 18 can be avoided, thereby reducing the dimensional constraints for designing the portable computer 1.

Also, in the above structure, the first and second slopes 43 and 44 of the casing 30 extend to the spaces 45a and 45b of the housing 4. Thus, the outer peripheral portion of the casing 30, which is expanded in a direction parallel to the axis of the impeller 31, is received in the spaces 45a and 45b. Therefore, the thickness of the housing 4 is not increased.

Figure 6:
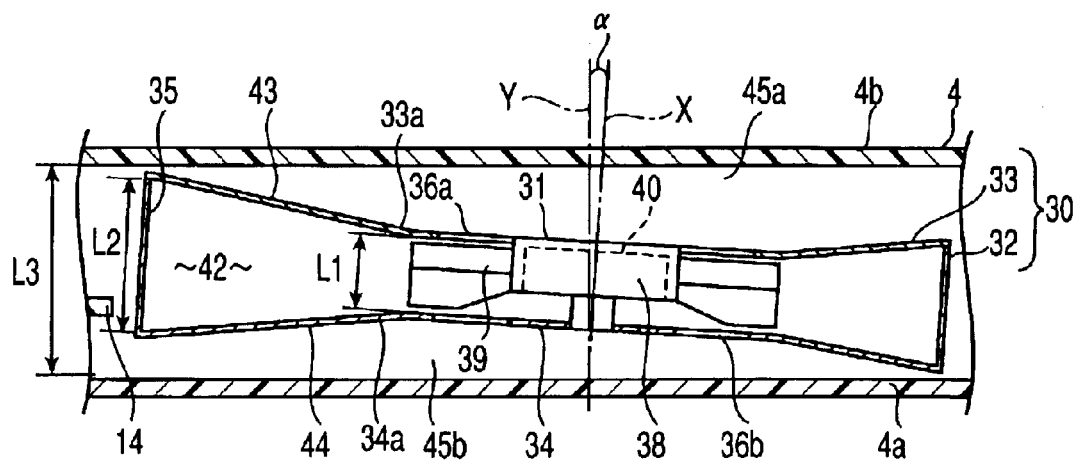
FIG. 6 is a sectional view illustrating a centrifugal blower unit according to a second embodiment of the invention.

The present invention is not limited to the above-described first embodiment. FIG. 6 shows a second embodiment of the invention. In the second embodiment, the centrifugal blower unit 23 is contained in the housing 4 such that the axis-of-rotation X of the impeller 31 is inclined by an angle α with respect to a perpendicular line Y parallel to the thickness direction of the housing 4.

In addition, in the first and second embodiments, suction ports are formed in the top and bottom plates of the casing, thereby introducing air from both sides of the impeller, the sides being perpendicular to its axis. However, the invention is not limited to this, and may be modified so that air is introduced from only one side of the impeller, the one side being perpendicular to the axis.

Further, the electronic apparatus of the invention is not limited to portable computers, but may be other types of electronic information devices.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A blower unit, comprising:

an impeller: and a casing including the impeller, the casing having a suction port, a swirl chamber located around the impeller and used to gather air discharged from an outer periphery of the impeller, and a discharged port located at a downstream end of the swirl chamber, wherein the casing includes first and second disk shaped plates opposing each other, said first disk shaped plate having an outer peripheral portion having a first slope, said second disk shaped plate having an outer peripheral portion having a second slope, said first and second slopes being inclined away from each other in a direction extending radially away from the impeller, such that a volume of said swirl chamber increases in said direction.

2. A blower unit according to claim 1, wherein each of the plates has the suction port, and the impeller is located between the plates.

3. A blower unit comprising:

an impeller; and a casing including the impeller, the casing having a suction port which introduces air into a center of rotation of the impeller, a swirl chamber located around the impeller and used to gather air discharged from an outer periphery of the impeller, and a discharge port located at a downstream end of the swirl chamber, the swirl chamber having an inner periphery defined by an outer periphery of the impeller, and an outer periphery radially spaced from the outer periphery of the impeller, L2>L1 being satisfied where L2 and L1 represent lengths of the outer and inner peripheries of the swirl chamber, respectively, wherein the casing includes first and second disk shaped plates opposing each other, said first disk shaped plate having an outer peripheral portion having a first slope, said second disk shaped plate having an outer peripheral portion having a second slope, said first and second slopes being inclined away from each other in a direction extending radially away from the impeller, such that a volume of said swirl chamber increases in said direction.

4. A blower unit according to claim 3, wherein the swirl chamber has a swirl start position and a swirl end position away from the swirl start position in a direction of rotation of the impeller, and the length L2 of the outer periphery of the swirl chamber gradually increases from the swirl start position to the swirl end position.

5. An electronic apparatus comprising:
a housing containing a heat generating component;
a blower unit included in the housing and used to cool the heat generating component, the blower unit including:
an impeller; and
a casing including the impeller, the casing having a suction port, a swirl chamber located around the impeller and used to gather air discharged from an outer periphery of the impeller, and a discharged port located at a downstream end of the swirl chamber, wherein the casing includes first and second disk shaped plates opposing each other, said first disk shaped plate having an outer peripheral portion having a first slope, said second disk shaped plate having an outer peripheral portion having a second slope, said first and second slopes being inclined away from each other in a direction extending radially away from the impeller, such that a volume of said swirl chamber increases in said direction.

6. An electronic apparatus according to claim 5, wherein the housing has a bottom watt and an upper wall opposing the bottom wall, and respective spaces are defined between the bottom wall and the casing and between the upper wall and the casing.

7. An electronic apparatus according to claim 6, wherein the casing includes a pair of disk-shaped plates opposing each other, each of the plates has the suction port, and the impeller is located between the plates.

8. An electronic apparatus according to claim 7, wherein the plates of the casing have respective outer peripheral portions which define the swirl chamber, the outer peripheral portion of each of the plates has the slope, the slopes of the outer peripheral portions are inclined away from each other as they are radially away from the impeller, the slopes extending to the spaces.

9. An electronic apparatus according to claim 5, wherein the blower unit is contained in the housing with an axis-of-rotation of the impeller inclined to a perpendicular line parallel to a thickness direction of the housing.

10. An electronic apparatus according to claim 5, wherein the housing contains a radiator section thermally connected to the heat generating component and located at the discharge port of the casing.

* * * * *

UNITED STATES PATENT AND TRADEMARK OFFICE
CERTIFICATE OF CORRECTION

PATENT NO. : 6,917,521 B2
DATED : July 12, 2005
INVENTOR(S) : Tomioka et al.

It is certified that error appears in the above-identified patent and that said Letters Patent is hereby corrected as shown below:

Column 6,
Line 40, change "impeller:" to -- impeller; --.

Column 7,
Lines 1-2, change "impeller ," to -- impeller, --.

Column 8,
Line 8, change "watt" to -- wall --.

Signed and Sealed this

Eighth Day of November, 2005

JON W. DUDAS
*Director of the United States Patent and Trademark Office*